(12) United States Patent
Aoshima

(10) Patent No.: US 12,411,338 B2
(45) Date of Patent: Sep. 9, 2025

(54) MICROMIRROR DEVICE AND OPTICAL SCANNING DEVICE

(71) Applicant: FUJIFILM Corporation, Tokyo (JP)

(72) Inventor: Keisuke Aoshima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 437 days.

(21) Appl. No.: 18/163,611

(22) Filed: Feb. 2, 2023

(65) Prior Publication Data

US 2023/0185081 A1     Jun. 15, 2023

Related U.S. Application Data

(63) Continuation of application No. PCT/JP2021/024536, filed on Jun. 29, 2021.

(30) Foreign Application Priority Data

Aug. 4, 2020  (JP) ................. 2020-132638

(51) Int. Cl.
    *G02B 26/08*   (2006.01)
    *B81B 3/00*    (2006.01)
    *G02B 26/10*   (2006.01)

(52) U.S. Cl.
    CPC ........ *G02B 26/0858* (2013.01); *B81B 3/0045* (2013.01); *G02B 26/101* (2013.01);
    (Continued)

(58) Field of Classification Search
    CPC ............. G02B 26/0858; G02B 26/101; B81B 3/0045; B81B 3/0072; B81B 2201/042; B81B 2203/058; B81B 2203/0154
    See application file for complete search history.

(56) References Cited

U.S. PATENT DOCUMENTS

| 10,310,253 B2 | 6/2019 | Carminati et al. |
| 2013/0107339 A1 | 5/2013 | Horie et al. |

(Continued)

FOREIGN PATENT DOCUMENTS

| EP | 3 640 704 A1 | 4/2020 |
| JP | 2016-206235 A | 12/2016 |

(Continued)

OTHER PUBLICATIONS

International Preliminary Report on Patentability and Written Opinion of the International Searching Authority for International Application No., PCT/JP2021/024536, dated Feb. 16, 2023, with an English translation.

(Continued)

*Primary Examiner* — Bumsuk Won
*Assistant Examiner* — Alex Park Rickel
(74) *Attorney, Agent, or Firm* — Birch, Stewart, Kolasch & Birch, LLP

(57) ABSTRACT

A micromirror device includes a first support portion that is connected to the mirror portion on a first axis located in a plane including the reflecting surface of the mirror portion in a stationary state, and that swingably supports the mirror portion around the first axis. The first support portion is composed of a main shaft stretched along the first axis and a plurality of sub-shafts symmetrically disposed on both sides of the main shaft across the first axis and stretched along the first axis, the first support portion has a folded structure having three or more folded portions formed by connecting the plurality of sub-shafts, and in a case where inner curvature radii of the folded portions are denoted by $R_1, R_2, R_3, \ldots$, in order from the closest to the first axis, a relationship of $0.73 \leq R_{k+1}/R_k \leq 0.9$ ($k=1, 2, \ldots$) is satisfied.

8 Claims, 16 Drawing Sheets

(52) U.S. Cl.
 CPC ....... *B81B 3/0072* (2013.01); *B81B 2201/042* (2013.01); *B81B 2203/0154* (2013.01); *B81B 2203/058* (2013.01)

(56) References Cited

U.S. PATENT DOCUMENTS

| | | |
|---|---|---|
| 2015/0323783 A1 | 11/2015 | Horie et al. |
| 2017/0210278 A1 | 7/2017 | Matsuno |
| 2018/0039074 A1 | 2/2018 | Oyama et al. |
| 2018/0180873 A1 | 6/2018 | Carminati et al. |
| 2020/0049978 A1* | 2/2020 | Ogata ................ G02B 26/0858 |
| 2020/0057298 A1* | 2/2020 | Boni .................. G02B 26/0858 |

FOREIGN PATENT DOCUMENTS

| | | |
|---|---|---|
| JP | 2017-132281 A | 8/2017 |
| WO | WO 2011/161943 A1 | 12/2011 |
| WO | WO 2013/168385 A1 | 11/2013 |

OTHER PUBLICATIONS

International Search Report for International Application No. PCT/JP2021/024536, dated Sep. 21, 2021, with an English translation.
Extended European Search Report for corresponding European Application No. 21854377.5, dated Dec. 11, 2023.

\* cited by examiner

FIG. 15

| PARAMETER | SET VALUE (mm) | PARAMETER | SET VALUE (mm) |
|---|---|---|---|
| $R_m$ | 0.75 | $L_c$ | 0.8 |
| $L_a$ | 0.63825 | $W_c$ | 0.28 |
| $W_a$ | 0.185 | $L_g$ | 0.95 |
| $R_0$ | 0.17608 | $W_g$ | 0.3 |
| $\delta$ | 0.9 | $W_d$ | 0.16 |
| $W_b$ | 0.12 | $\Delta 1$ | 0.085 |
| $W_r$ | 0.12 | $\Delta 2$ | 0.05 |
| $X_{r1}$ | 1.23191 | $\Delta 3$ | 0.4 |
| $X_{r2}$ | 1.02796 | $\Delta 4$ | 0.25 |
| $X_{r3}$ | 1.14471 | $W_{ac}$ | 0.16 |
| $W_h$ | 0.065 | $X_{ac}$ | 2.415 |
| $R_s$ | 0.8 | $Y_{ac}$ | 2.515 |
| $W_f$ | 0.13 | $W_s$ | 0.05935 |
| $R_f$ | 1.045 | $\theta_s$ | 12.5 (°) |
| $L_X$ | 6.1 | $D_1$ | 0.350 |
| $L_Y$ | 6.1 | $D_2$ | 0.125 |
| | | $D_3$ | 0.060 |

FIG. 16

| MODEL No. | COMPARATIVE EXAMPLE | | | | | EXAMPLE | | | | | | |
|---|---|---|---|---|---|---|---|---|---|---|---|---|
| | 1 | 2 | 3 | 4 | 5 | 6 | 7 | 8 | 9 | 10 | 11 | 12 |
| $R_1$ (μm) | 45.00 | 50.00 | 50.00 | 55.00 | 60.00 | 67.90 | 55.56 | 74.07 | 70.31 | 91.67 | 75.00 | 84.44 |
| $R_2$ (μm) | 45.00 | 45.00 | 50.00 | 55.00 | 60.00 | 61.11 | 50.00 | 66.67 | 56.25 | 68.75 | 60.00 | 61.64 |
| $R_3$ (μm) | 45.00 | 45.00 | 45.00 | 55.00 | 60.00 | 55.00 | 45.00 | 60.00 | 45.00 | 55.00 | 45.00 | 45.00 |
| $R_2/R_1$ | 1.00 | 1.00 | 0.90 | 1.00 | 1.00 | 0.90 | 0.90 | 0.90 | 0.80 | 0.80 | 0.80 | 0.73 |
| $R_3/R_2$ | 1.00 | 0.90 | 1.00 | 1.00 | 1.00 | 0.90 | 0.90 | 0.90 | 0.80 | 0.75 | 0.75 | 0.73 |
| $f_1$ (kHz) | 18.31 | 18.27 | 18.25 | 18.11 | 18.01 | 17.93 | 18.13 | 17.85 | 17.94 | 17.72 | 17.86 | 17.76 |
| $f_2$ (kHz) | 34.77 | 34.81 | 34.81 | 35.01 | 35.13 | 35.13 | 35.18 | 35.01 | 35.17 | 35.04 | 35.14 | 35.15 |
| $\sigma_{Mises}$ (GPa) | 3.45 | 2.73 | 2.48 | 2.67 | 2.28 | 2.25 | 2.19 | 2.18 | 2.18 | 2.19 | 2.19 | 2.15 |
| DETERMINATION | F | F | F | F | F | P | P | P | P | P | P | P |

MICROMIRROR DEVICE AND OPTICAL SCANNING DEVICE

CROSS-REFERENCE TO RELATED APPLICATION

This application is a continuation application of International Application No. PCT/JP2021/024536, filed Jun. 29, 2021, the disclosure of which is incorporated herein by reference in its entirety. Further, this application claims priority from Japanese Patent Application No. 2020-132638 filed on Aug. 4, 2020, the disclosure of which is incorporated herein by reference in its entirety.

BACKGROUND

1. Technical Field

The technique of the present disclosure relates to a micromirror device and an optical scanning device.

2. Description of the Related Art

A micromirror device (also referred to as a microscanner) is known as one of micro electro mechanical systems (MEMS) devices manufactured using the silicon (Si) nanofabrication technique. Since the micromirror device is small and has low power consumption, it is expected to have a wide range of applications in laser displays, laser projectors, optical coherence tomography, and the like.

There are various drive methods for the micromirror device, and a piezoelectric drive method using deformation of a piezoelectric body is promising since the generated torque is higher than that in other methods and a high scan angle can be obtained. In particular, in a case where a high scan angle is required, such as in a laser display, a higher scan angle can be obtained by driving the micromirror device of the piezoelectric drive method by resonance drive.

A general micromirror device used in a laser display comprises a mirror portion and a piezoelectric actuator (see, for example, JP2017-132281A). The mirror portion is swingable around a first axis and a second axis that are orthogonal to each other. The actuator allows the mirror portion to swing around the first axis and the second axis according to the driving voltage supplied from the outside. The scan angle described above corresponds to a maximum value of a deflection angle (hereinafter, referred to as a maximum deflection angle) of the mirror portion.

As performance indicators of the laser display, resolution and viewing angle are mentioned. The resolution and viewing angle are related to a swing frequency and a maximum deflection angle of the mirror portion of the micromirror device. For example, in a Lissajous scanning type laser display, two-dimensional optical scanning is performed by allowing the mirror portion to swing simultaneously at two different frequencies around the first axis and the second axis.

In the biaxial drive type micromirror device as described above, a gimbal structure is adopted in many cases. A micromirror device having a gimbal structure includes, for example, a mirror portion, a first support portion, a movable frame, and a second support portion. The first support portion swingably supports the mirror portion around the first axis. The movable frame is connected to the first support portion. The second support portion is connected to the movable frame, and swingably supports the mirror portion and the movable frame around the second axis.

Here, in order to improve the maximum deflection angle of the mirror portion around the first axis, it is necessary to relax an internal stress applied to the first support portion during swing so that the internal stress does not reach a limit stress of Si. It is known that the movable frame is provided with a folded structure in order to relax the internal stress applied to the first support portion.

For example, JP2016-206235A discloses that a coupling portion having a folded structure is connected to an end portion of a torsion beam corresponding to a first support portion on a side opposite to a mirror portion (see FIG. 3 of JP2017-132281A). The folded structure is configured by forming a first slit and a second slit in the coupling portion. The first slit and the second slit extend linearly along a direction parallel to the mirror plane and orthogonal to the torsion beam.

SUMMARY

In the micromirror device disclosed in JP2016-206235A, it is necessary to increase lengths of the first slit and the second slit in order to relax the stress applied to the torsion beam. Since the micromirror device disclosed in JP2016-206235A is a uniaxial drive type, the lengths of the first slit and the second slit do not affect the swing of the mirror portion.

However, in a case where the micromirror device disclosed in JP2016-206235A is applied to the biaxial drive type, increasing the lengths of the first slit and the second slit increases the moment of inertia around a second axis provided on an outside of the coupling portion. As the moment of inertia around the second axis increases, a resonance frequency around the second axis decreases. This results in resolution reduction due to optical scanning.

In addition, stretching the first support portion is considered as a simple method for relaxing the internal stress applied to the first support portion. However, even in this case, the moment of inertia around the second axis increases by increasing a length of the first support portion, and the resonance frequency around the second axis decreases.

As described above, in the biaxial drive type micromirror device, it is desired that the maximum deflection angle around the first axis can be increased by relaxing the internal stress applied to the first support portion without decreasing the resonance frequency around the second axis.

An object of the technique of the present disclosure is to provide a micromirror device and an optical scanning device capable of increasing a maximum deflection angle around a first axis without decreasing a resonance frequency around a second axis.

In order to achieve the above object, according to the present disclosure, there is provided a micromirror device comprising: a mirror portion having a reflecting surface that reflects incident light; a first support portion that is connected to the mirror portion on a first axis located in a plane including the reflecting surface of the mirror portion in a stationary state, and that swingably supports the mirror portion around the first axis; a pair of movable frames that are connected to the first support portion and face each other across the first axis; a second support portion that is connected to the movable frame on a second axis which is located in the plane including the reflecting surface of the mirror portion in the stationary state and is orthogonal to the first axis, and that swingably supports the mirror portion, the first support portion, and the movable frame around the second axis; and a pair of first actuators that are connected to the second support portion and face each other across the second axis, each of which having a piezoelectric element, in which the first support portion is composed of a main shaft stretched along the first axis and a plurality of sub-shafts symmetrically disposed on both sides of the main shaft across the first axis and stretched along the first axis, the first support portion has a folded structure having three or more folded portions formed by connecting the plurality of sub-shafts, and in a case where inner curvature radii of the folded portions are denoted by $R_1, R_2, R_3, \ldots$, in order from the closest to the first axis, a relationship of $0.73 \leq R_{k+1}/R_k \leq 0.9$ ($k=1, 2, \ldots$) is satisfied.

It is preferable that the main shaft and the plurality of sub-shafts each have a uniform thickness.

It is preferable that at least a part of a width of the first actuator in a direction orthogonal to a stretching direction is larger than a width of the main shaft in a direction along the second axis.

It is preferable that the movable frame and the first actuator each have a U-shape.

It is preferable that the first actuator allows the mirror portion to swing around the second axis by applying a rotational torque around the second axis to the mirror portion and the movable frame.

It is preferable that the micromirror device further comprises: a fixed frame that surrounds the first actuator; a connecting portion that connects the first actuator and the fixed frame; and a second actuator that is connected to the connecting portion and is disposed inside the fixed frame and, the second actuator having a piezoelectric element, and that the second actuator allows the mirror portion to swing around the first axis by applying a rotational torque around the first axis to the mirror portion, the movable frame, and the first actuator.

It is preferable that the connecting portion is disposed along the first axis.

According to the present disclosure, there is provided an optical scanning device of the present disclosure comprising: the micromirror device according to any one of the aspects described above; a processor that drives the first actuator and the second actuator, in which the processor allows the mirror portion to resonate around the first axis and the second axis by giving a driving signal to the first actuator and the second actuator.

According to the technique of the present disclosure, it is possible to provide a micromirror device and an optical scanning device capable of increasing a maximum deflection angle around a first axis without decreasing a resonance frequency around a second axis.

BRIEF DESCRIPTION OF THE DRAWINGS

Exemplary embodiments according to the technique of the present disclosure will be described in detail based on the following figures, wherein:

FIG. 15 is a diagram showing set values of various parameters used in simulation, FIG. 16 is a diagram showing simulation results for a plurality of models.

DETAILED DESCRIPTION

An example of an embodiment relating to the technique of the present disclosure will be described with reference to the accompanying drawings.

Figure 1:
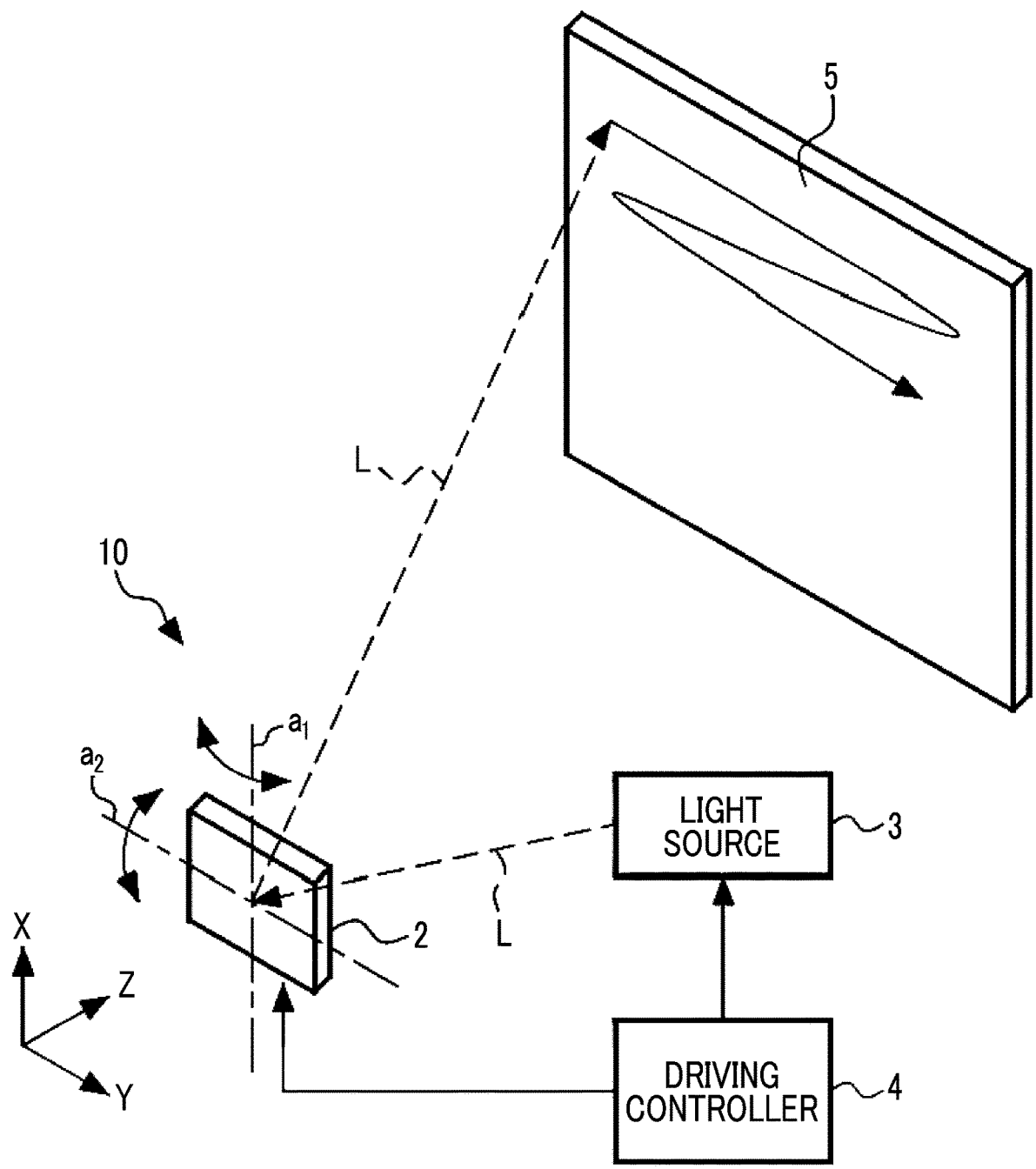
FIG. 1 is a schematic view of an optical scanning device.

FIG. 1 schematically shows an optical scanning device 10 according to an embodiment. The optical scanning device 10 includes a micromirror device (hereinafter, referred to as micromirror device (MMD)) 2, a light source 3, and a driving controller 4. The optical scanning device 10 optically scans a surface to be scanned 5 by reflecting a light beam L emitted from the light source 3 by the MMD 2 under the control of the driving controller 4. The surface to be scanned 5 is, for example, a screen.

The MMD 2 is a piezoelectric biaxial drive type micromirror device capable of allowing a mirror portion 20 (see FIG. 3) to swing around a first axis $a_1$ and a second axis $a_2$ orthogonal to the first axis $a_1$. Hereinafter, the direction parallel to the first axis $a_1$ is referred to as an X direction, the direction parallel to the second axis $a_2$ is a Y direction, and the direction orthogonal to the first axis $a_1$ and the second axis $a_2$ is referred to as a Z direction.

The light source 3 is a laser device that emits, for example, laser light as the light beam L. It is preferable that the light source 3 emits the light beam L perpendicularly to a reflecting surface 20A (see FIG. 3) included in the mirror portion 20 in a state where the mirror portion 20 of the MMD 2 is stationary.

The driving controller 4 outputs a driving signal to the light source 3 and the MMD 2 based on optical scanning information. The light source 3 generates the light beam L based on the input driving signal and emits the light beam L to the MMD 2. The MMD 2 allows the mirror portion 20 to swing around the first axis $a_1$ and the second axis $a_2$ based on the input driving signal.

As will be described in detail below, the driving controller 4 allows the mirror portion 20 to resonate around the first axis a and the second axis $a_2$, so that the surface to be scanned 5 is scanned with the light beam L reflected by the mirror portion 20 such that a Lissajous waveform is drawn. This optical scanning method is called a Lissajous scanning method.

The optical scanning device 10 is applied to, for example, a Lissajous scanning type laser display. Specifically, the optical scanning device 10 can be applied to a laser scanning display such as augmented reality (AR) glass or virtual reality (VR) glass.

Figure 2:
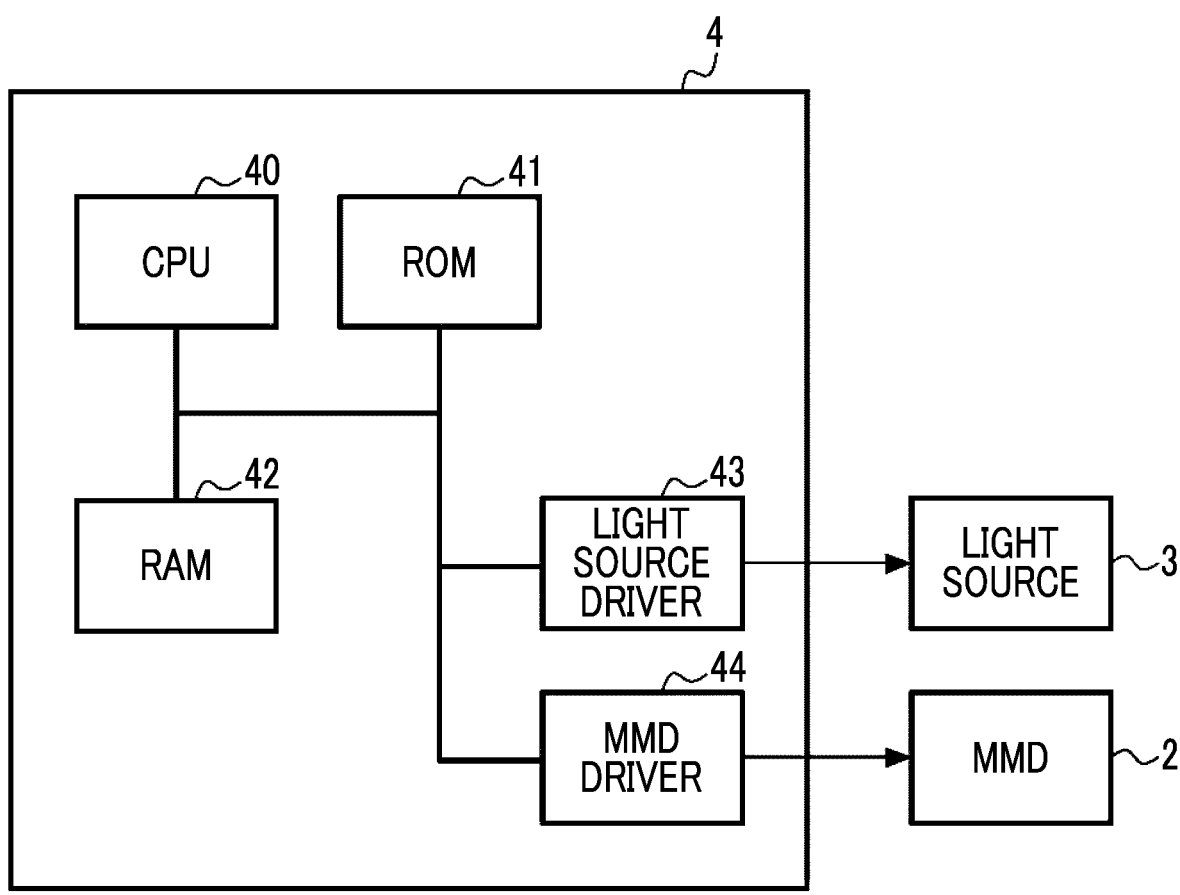
FIG. 2 is a block diagram showing an example of a hardware configuration of a driving controller.

FIG. 2 shows an example of a hardware configuration of the driving controller 4. The driving controller 4 has a central processing unit (CPU) 40, a read only memory (ROM) 41, a random access memory (RAM) 42, a light source driver 43, and an MMD driver 44. The CPU 40 is an arithmetic unit that realizes the entire function of the driving controller 4 by reading out a program and data from a storage device such as the ROM 41 into the RAM 42 and executing processing. The CPU 40 is an example of a "processor" according to the technique of the present disclosure.

The ROM 41 is a non-volatile storage device and stores a program for the CPU 40 to execute processing and data such as the optical scanning information described above. The RAM 42 is a non-volatile storage device that temporarily holds a program and data.

The light source driver 43 is an electric circuit that outputs a driving signal to the light source 3 under the control of the CPU 40. In the light source driver 43, the driving signal is a driving voltage for controlling the irradiation timing and the irradiation intensity of the light source 3.

The MMD driver 44 is an electric circuit that outputs a driving signal to the MMD 2 under the control of the CPU 40. In the MMD driver 44, the driving signal is a driving voltage for controlling the timing, cycle, and deflection angle for allowing the mirror portion 20 of the MMD 2 to swing.

The CPU 40 controls the light source driver 43 and the MMD driver 44 based on the optical scanning information. The optical scanning information is information including the scanning pattern of the light beam L with which the surface to be scanned 5 is scanned and the light emission timing of the light source 3.

Figure 3:
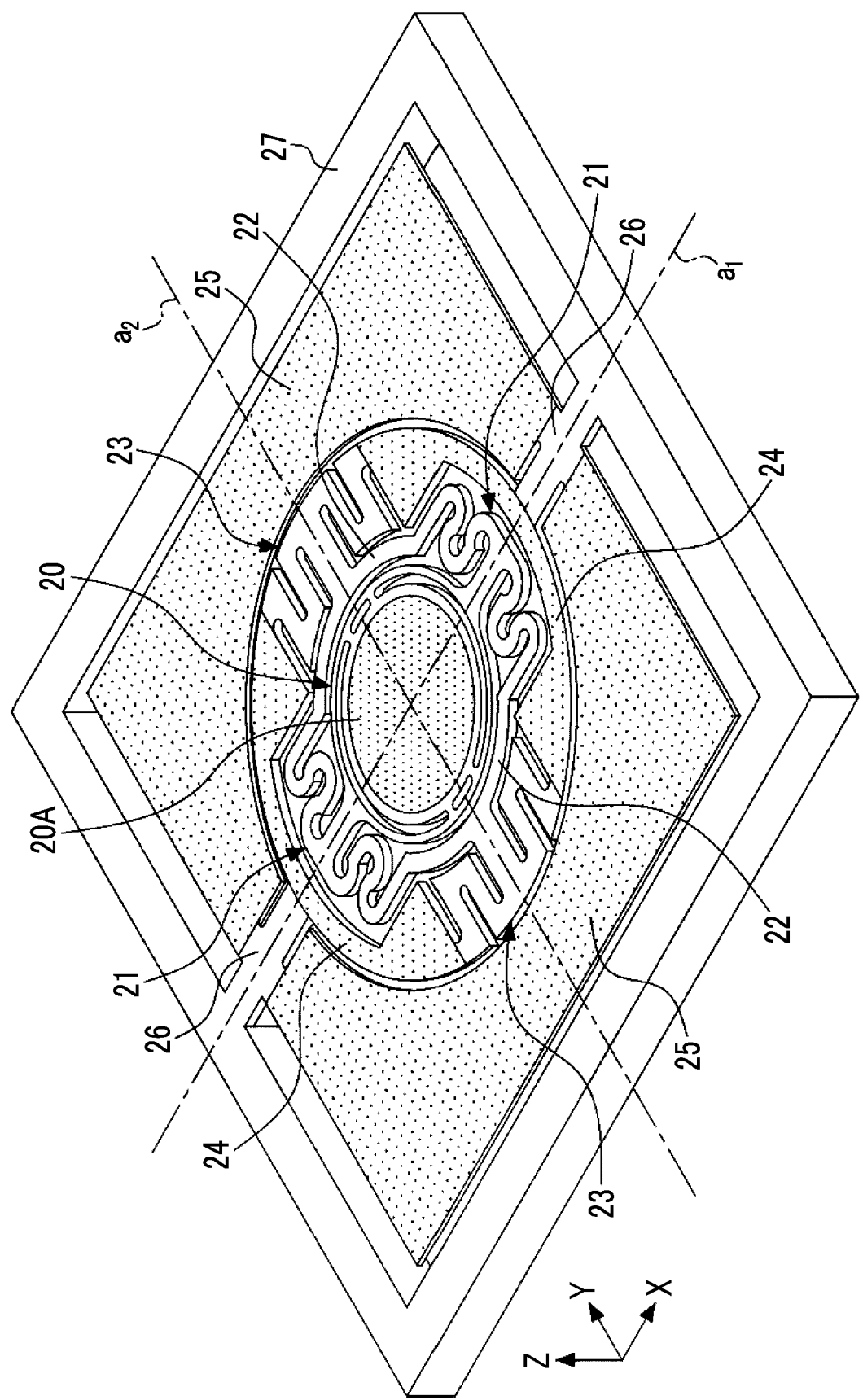
FIG. 3 is an external perspective view of a micromirror device.
Figure 4:
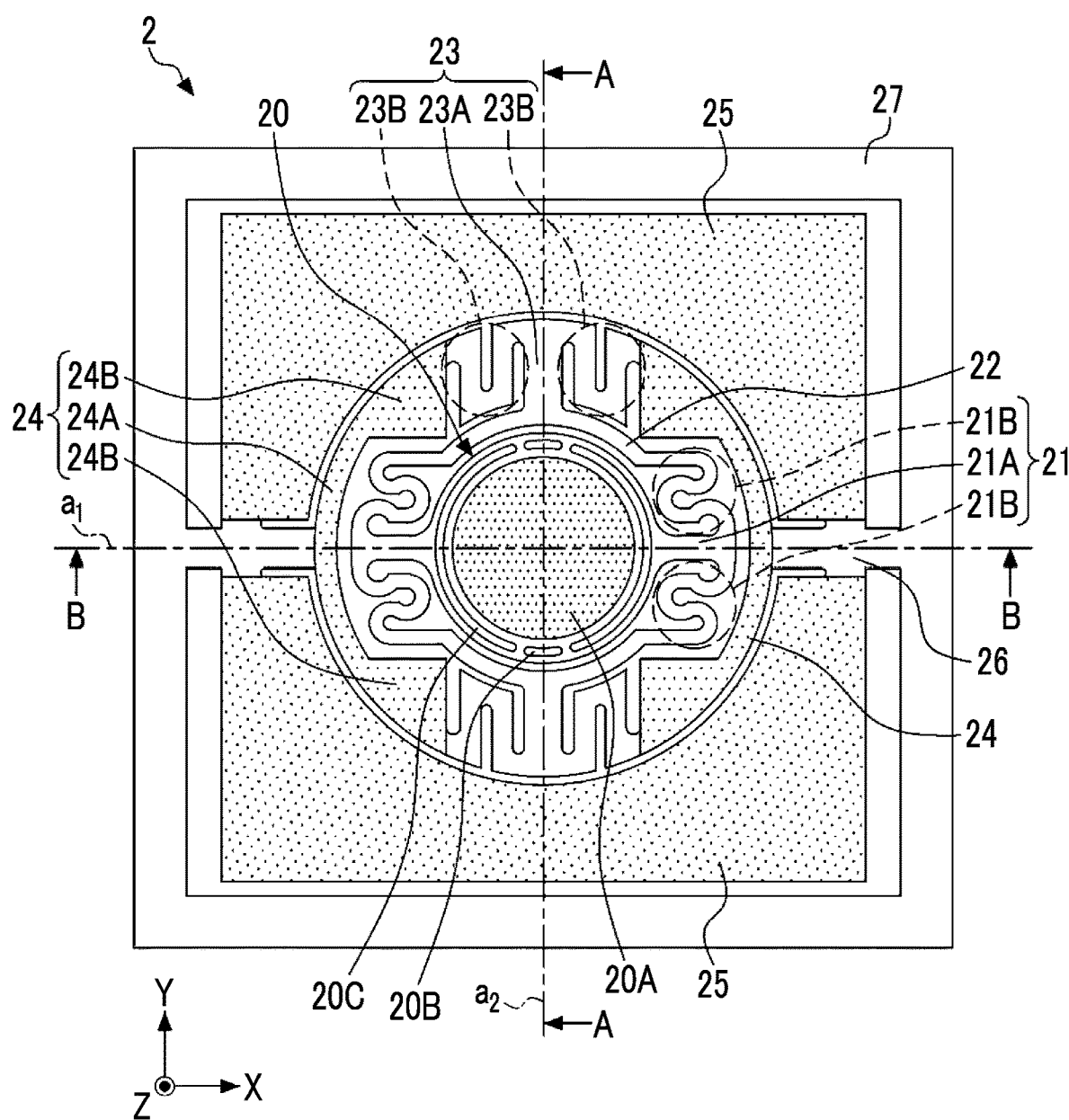
FIG. 4 is a plan view of the micromirror device as viewed from the light incident side.
Figure 5:
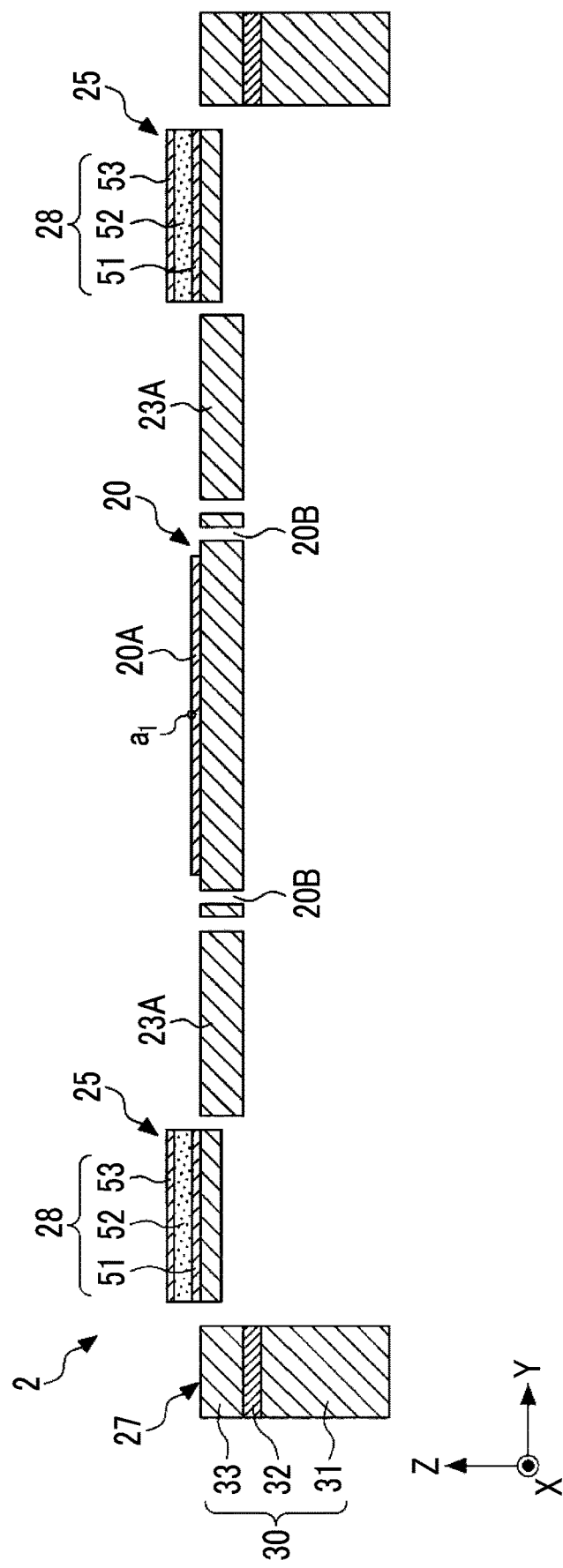
FIG. 5 is a cross-sectional view taken along the line A-A of FIG. 4.
Figure 6:
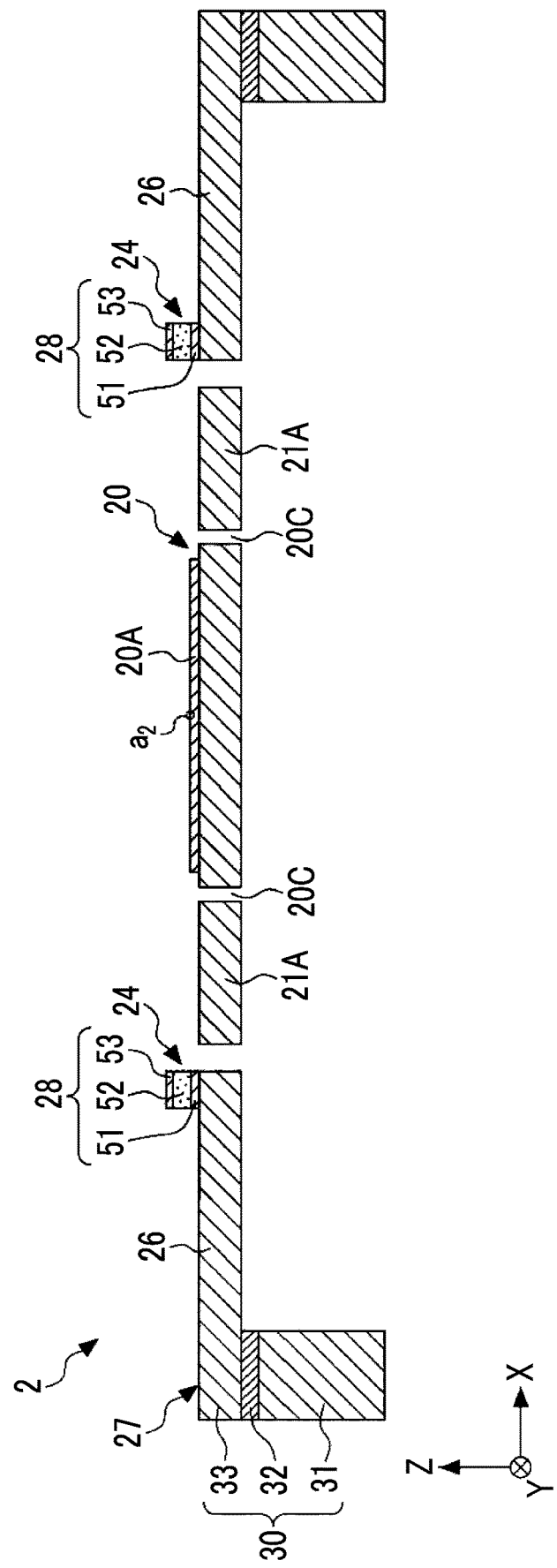
FIG. 6 is a cross-sectional view taken along the line B-B of FIG. 4.

Next, an example of the MMD 2 will be described with reference to FIGS. 3 to 6. FIG. 3 is an external perspective view of the MMD 2. FIG. 4 is a plan view of the MMD 2 as viewed from the light incident side. FIG. 5 is a cross-sectional view taken along the line A-A in FIG. 4. FIG. 6 is a cross-sectional view taken along the line B-B in FIG. 4.

As shown in FIG. 3, the MMD 2 has the mirror portion 20, a pair of first support portions 21, a pair of movable frames 22, a pair of second support portions 23, a pair of first actuators 24, a pair of second actuators 25, a pair of connecting portions 26, and a fixed frame 27. The MMD 2 is a so-called MEMS scanner.

The mirror portion 20 has a reflecting surface 20A for reflecting incident light. The reflecting surface 20A provided on one surface of the mirror portion 20, and is formed of a metal thin film such as gold (Au) and aluminum (Al). The shape of the reflecting surface 20A is, for example, circular with the intersection of the first axis $a_1$ and the second axis $a_2$ as the center.

The first axis $a_1$ and the second axis $a_2$ exist in a plane including the reflecting surface 20A in a case where the mirror portion 20 is stationary. The planar shape of the MMD 2 is rectangular, line-symmetrical with respect to the first axis $a_1$, and line-symmetrical with respect to the second axis $a_2$.

The pair of first support portions 21 are disposed at positions facing each other across the second axis $a_2$, and have a shape that is line-symmetrical with respect to the second axis $a_2$. In addition, each of the first support portions 21 has a shape that is line-symmetrical with respect to the first axis $a_1$. The first support portions 21 are connected to the mirror portion 20 on the first axis $a_1$, and swingably support the mirror portion 20 around the first axis $a_1$.

The pair of movable frames 22 are disposed at positions facing each other across the first axis $a_1$, and have a shape that is line-symmetrical with respect to the first axis $a_1$. Each of the movable frames 22 has a shape that is line-symmetrical with respect to the second axis $a_2$. In addition, each of the movable frames 22 has a U-shape curved in an arc shape along the outer periphery of the mirror portion 20. Both ends of the movable frame 22 are connected to the first support portion 21.

The first support portion 21 and the movable frame 22 are connected to each other to surround the mirror portion 20.

The pair of second support portions 23 are disposed at positions facing each other across the first axis $a_1$, and have a shape that is line-symmetrical with respect to the first axis $a_1$. Each of the second support portions 23 has a shape that is line-symmetrical with respect to the second axis $a_2$. The second support portion 23 is connected to the movable frame 22 on the second axis $a_2$, and swingably supports the mirror portion 20, the first support portion 21, and the movable frame 22 around the second axis $a_2$. In addition, both ends of the second support portion 23 are connected to the first actuator 24.

The pair of first actuators 24 are disposed at positions facing each other across the second axis $a_2$, and have a shape that is line-symmetrical with respect to the second axis $a_2$. In addition, each of the first actuators 24 has a shape that is line-symmetrical with respect to the first axis $a_1$. The first actuator 24 has a U-shape curved along the outer periphery of the first support portion 21. The first actuator 24 is a piezoelectric actuator comprising a piezoelectric element.

The second support portion 23 and the first actuator 24 are connected to each other to surround the mirror portion 20, the first support portion 21, and the movable frame 22.

The pair of second actuators 25 are disposed at positions facing each other across the first axis $a_1$, and have a shape that is line-symmetrical with respect to the first axis $a_1$. In addition, each of the second actuators 25 has a shape that is line-symmetrical with respect to the second axis $a_2$. The second actuator 25 has a U-shape curved along the outer periphery of the first actuator 24 and the second support portion 23. In addition, both ends of the second actuator 25 are connected to the connecting portion 26.

The pair of connecting portions 26 are disposed at positions facing each other across the second axis $a_2$, and have a shape that is line-symmetrical with respect to the second axis $a_2$. In addition, each of the connecting portions 26 has a shape that is line-symmetrical with respect to the first axis $a_1$. The connecting portion 26 is disposed along the first axis $a_1$, and connects the first actuator 24 and the fixed frame 27 on the first axis $a_1$. The second actuator 25 is connected to a central portion of the connecting portion 26.

The second actuator 25 and the connecting portion 26 are connected to each other to surround the mirror portion 20, the first support portion 21, the movable frame 22, and the first actuator 24.

The fixed frame 27 is a frame-shaped member having a rectangular outer shape, and has a shape that is line-symmetrical with respect to each of the first axis $a_1$ and the second axis $a_2$. The fixed frame 27 surrounds the outer periphery of the second actuator 25 and the connecting portion 26. That is, the fixed frame 27 surrounds the first actuator 24. In addition, the second actuator 25 is disposed inside the fixed frame 27.

The first actuator 24 and the second actuator 25 are piezoelectric actuators each comprising a piezoelectric element. The pair of first actuators 24 allow the mirror portion 20 to swing around the second axis $a_2$ by applying rotational torque around the second axis $a_2$ to the mirror portion 20 and the movable frame 22. The pair of second actuators 25 allow the mirror portion 20 to swing around the first axis $a_1$ by applying rotational torque around the first axis $a_1$ to the mirror portion 20, the movable frame 22, and the first actuator 24.

As shown in FIG. 4, the first support portion 21 is composed of a swing shaft 21A and a pair of coupling portions 21B. The swing shaft 21A is a so-called torsion bar stretched along the first axis $a_1$. One end of the swing shaft 21A is connected to the mirror portion 20, and the other end thereof is connected to the coupling portion 21B. The swing shaft 21A is an example of a main shaft according to the technique of the present disclosure.

The pair of coupling portions 21B are disposed at positions facing each other across the first axis $a_1$, and have a shape that is line-symmetrical with respect to the first axis $a_1$. One end of the coupling portion 21B is connected to the swing shaft 21A, and the other end thereof is connected to the movable frame 22. The coupling portion 21B has a folded structure. Since the coupling portion 21B has elasticity due to the folded structure, the internal stress applied to the swing shaft 21A is relaxed in a case where the mirror portion 20 swings around the first axis $a_1$.

The second support portion 23 is composed of a swing shaft 23A and a pair of coupling portions 23B. The swing shaft 23A is a so-called torsion bar stretched along the second axis $a_2$. One end of the swing shaft 23A is connected to the movable frame 22, and the other end thereof is connected to the coupling portion 23B.

The pair of coupling portions 23B are disposed at positions facing each other across the second axis $a_2$, and have a shape that is line-symmetrical with respect to the second axis $a_2$. One end of the coupling portion 23B is connected to the swing shaft 23A, and the other end thereof is connected to the first actuator 24. The coupling portion 23B has a folded structure. Since the coupling portion 23B has elasticity due to the folded structure, the internal stress applied to the swing shaft 23A is relaxed in a case where the mirror portion 20 swings around the second axis $a_2$.

The first actuator 24 is composed of an arc-shaped portion 24A and a pair of fan-shaped portions 24B. The arc-shaped portion 24A has a shape that is line-symmetrical with respect to the first axis $a_1$. Both ends of the arc-shaped portion 24A are connected to the fan-shaped portion 24B.

The pair of fan-shaped portions 24B are disposed at positions facing each other across the first axis $a_1$, and have a shape that is line-symmetrical with respect to the first axis $a_1$. One end of the fan-shaped portion 24B is connected to the arc-shaped portion 24A, and the other end thereof is connected to the coupling portion 23B of the second support portion 23. Since the first actuator 24 has the fan-shaped portion 24B having a large area, an area of the piezoelectric element is large. As a result, a large driving torque is obtained around the second axis $a_2$ by the first actuator 24.

In the mirror portion 20, a plurality of slits 20B and 20C are formed on the outside of the reflecting surface 20A along the outer periphery of the reflecting surface 20A. The plurality of slits 20B and 20C are disposed at positions that are line-symmetrical with respect to the first axis $a_1$ and the second axis $a_2$, respectively. The slit 20B has an effect of suppressing distortion generated on the reflecting surface 20A due to the swing of the mirror portion 20.

In FIGS. 3 and 4, the wiring line and the electrode pad for giving the driving signal to the first actuator 24 and the second actuator 25 are not shown. A plurality of the electrode pads are provided on the fixed frame 27.

As shown in FIGS. 5 and 6, the MMD 2 is formed, for example, by performing an etching treatment on a silicon on insulator (SOI) substrate 30. The SOI substrate 30 is a substrate in which a silicon oxide layer 32 is provided on a first silicon active layer 31 made of single crystal silicon, and a second silicon active layer 33 made of single crystal silicon is provided on the silicon oxide layer 32.

The mirror portion 20, the first support portion 21, the movable frame 22, the second support portion 23, the first actuator 24, the second actuator 25, and the connecting portion 26 are formed of the second silicon active layer 33 remaining by removing the first silicon active layer 31 and the silicon oxide layer 32 from the SOI substrate 30 by an etching treatment. The second silicon active layer 33 functions as an elastic portion having elasticity. The fixed frame 27 is formed of three layers of the first silicon active layer 31, the silicon oxide layer 32, and the second silicon active layer 33.

The second actuator 25 is formed such that a thickness of the second silicon active layer 33 is thinner than that of the first actuator 24 by performing an etching treatment on the second silicon active layer 33. That is, the thickness of the second actuator 25 is thinner than that of the first actuator 24 in the Z direction.

The first actuator 24 and the second actuator 25 have the piezoelectric element 28 on the second silicon active layer 33. The piezoelectric element 28 has a laminated structure in which a lower electrode 51, a piezoelectric film 52, and an upper electrode 53 are sequentially laminated on the second silicon active layer 33. An insulating film is provided on the upper electrode 53, but is not shown.

The upper electrode 53 and the lower electrode 51 are formed of, for example, gold (Au) or platinum (Pt). The piezoelectric film 52 is formed of, for example, lead zirconate titanate (PZT), which is a piezoelectric material. The upper electrode 53 and the lower electrode 51 are electrically connected to the driving controller 4 described above via the wiring line and the electrode pad.

A driving voltage is applied to the upper electrode 53 from the driving controller 4. The lower electrode 51 is connected to the driving controller 4 via the wiring line and the electrode pad, and a reference potential (for example, a ground potential) is applied thereto.

In a case where a positive or negative voltage is applied to the piezoelectric film 52 in the polarization direction, deformation (for example, expansion and contraction) proportional to the applied voltage occurs. That is, the piezoelectric film 52 exerts a so-called inverse piezoelectric effect. The piezoelectric film 52 exerts an inverse piezoelectric effect by applying a driving voltage from the driving controller 4 to the upper electrode 53, and displaces the first actuator 24 and the second actuator 25.

Figure 7:
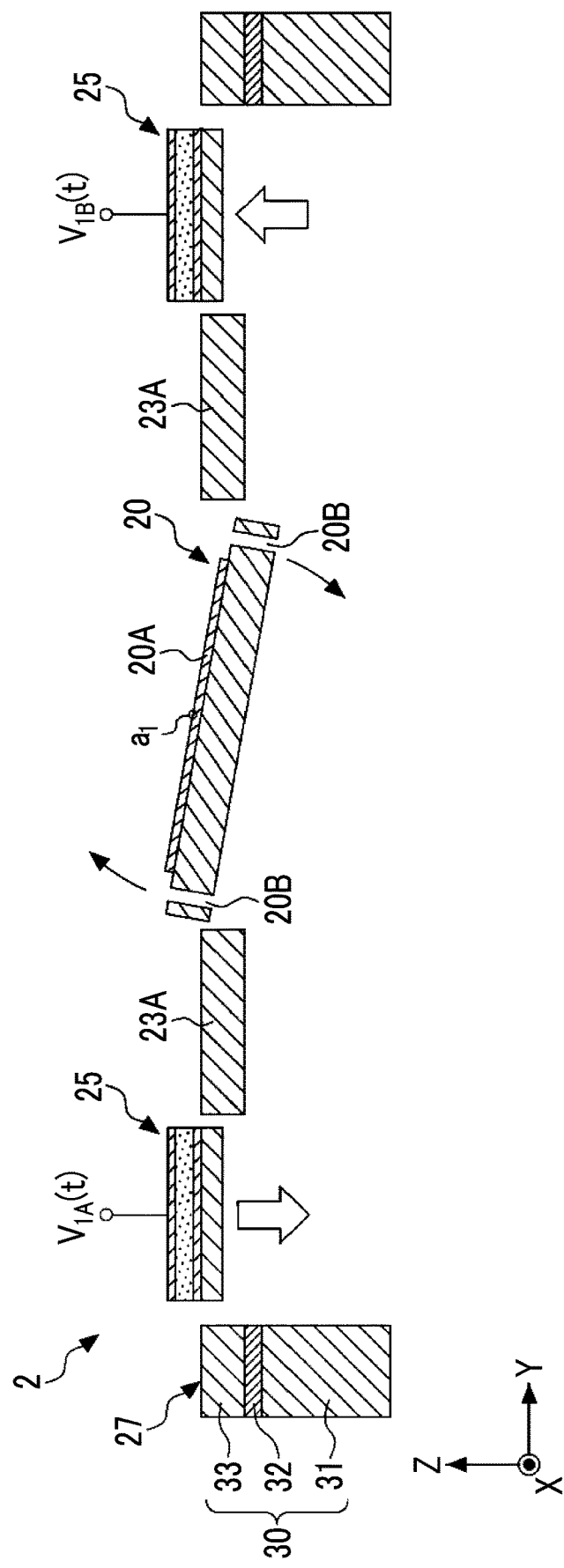
FIG. 7 is a diagram showing an example of driving a second actuator.

FIG. 7 shows an example in which one piezoelectric film 52 of the pair of second actuators 25 is extended and the other piezoelectric film 52 is contracted, thereby generating rotational torque around the first axis $a_1$ in the second actuator 25. In this way, one of the pair of second actuators 25 and the other are displaced in opposite directions to each other, whereby the mirror portion 20 rotates around the first axis $a_1$.

In addition, FIG. 7 shows an example in which the second actuator 25 is driven in an anti-phase resonance mode in which the displacement direction of the pair of second actuators 25 and the rotation direction of the mirror portion 20 are opposite to each other. The second actuator 25 may be driven in an in-phase resonance mode in which the displacement direction of the pair of second actuators 25 and the rotation direction of the mirror portion 20 are the same direction.

A deflection angle of the mirror portion 20 around the first axis $a_1$ is controlled by the driving signal (hereinafter, referred to as a first driving signal) given to the second actuator 25 by the driving controller 4. The first driving signal is, for example, a sinusoidal AC voltage. The first driving signal includes a driving voltage waveform $V_{1A}$ (t) applied to one of the pair of second actuators 25 and a driving voltage waveform $V_{1B}$ (t) applied to the other. The driving voltage waveform $V_{1A}$ (t) and the driving voltage waveform $V_{1B}$ (t) are in an anti-phase with each other (that is, the phase difference is 180°).

The deflection angle of the mirror portion 20 around the first axis $a_1$ means an angle at which the normal line of the reflecting surface 20A is inclined with respect to the Z direction in a YZ plane.

Figure 8:
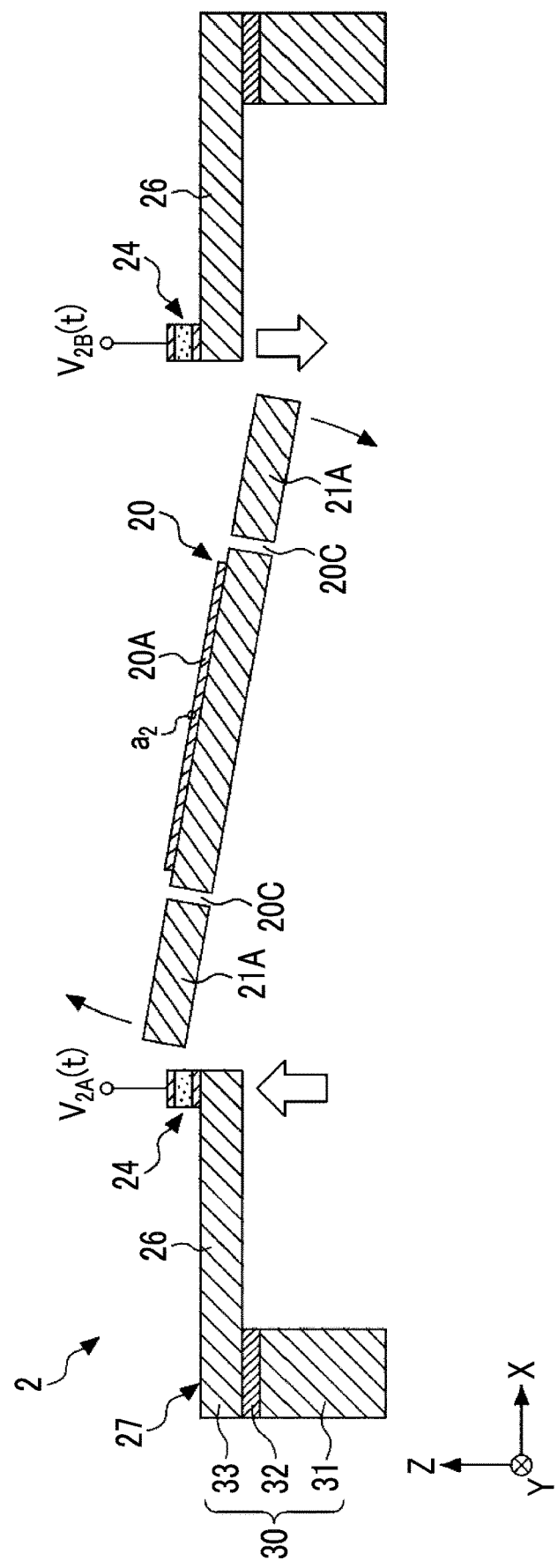
FIG. 8 is a diagram showing an example of driving a first actuator.

FIG. 8 shows an example in which one piezoelectric film 52 of the pair of first actuators 24 is extended and the other piezoelectric film 52 is contracted, thereby generating rotational torque around the second axis $a_2$ in the first actuator 24. In this way, one of the pair of first actuators 24 and the other are displaced in opposite directions to each other, whereby the mirror portion 20 rotates around the second axis $a_2$.

In addition, FIG. 8 shows an example in which the first actuator 24 is driven in an in-phase resonance mode in which the displacement direction of the pair of first actuators 24 and the rotation direction of the mirror portion 20 are the same direction. The first actuator 24 may be driven in an anti-phase resonance mode in which the displacement direction of the pair of first actuators 24 and the rotation direction of the mirror portion 20 are opposite to each other.

A deflection angle of the mirror portion 20 around the second axis $a_2$ is controlled by the driving signal (hereinafter, referred to as a second driving signal) given to the first actuator 24 by the driving controller 4. The second driving signal is, for example, a sinusoidal AC voltage. The second driving signal includes a driving voltage waveform $V_{2A}$ (t) applied to one of the pair of first actuators 24 and a driving voltage waveform $V_{2B}$ (t) applied to the other. The driving voltage waveform $V_{2A}$ (t) and the driving voltage waveform $V_{2B}$ (t) are in an anti-phase with each other (that is, the phase difference is 180°).

The deflection angle of the mirror portion 20 around the second axis $a_2$ means an angle at which the normal line of the reflecting surface 20A is inclined with respect to the Z direction in a XZ plane.

Figure 9A:
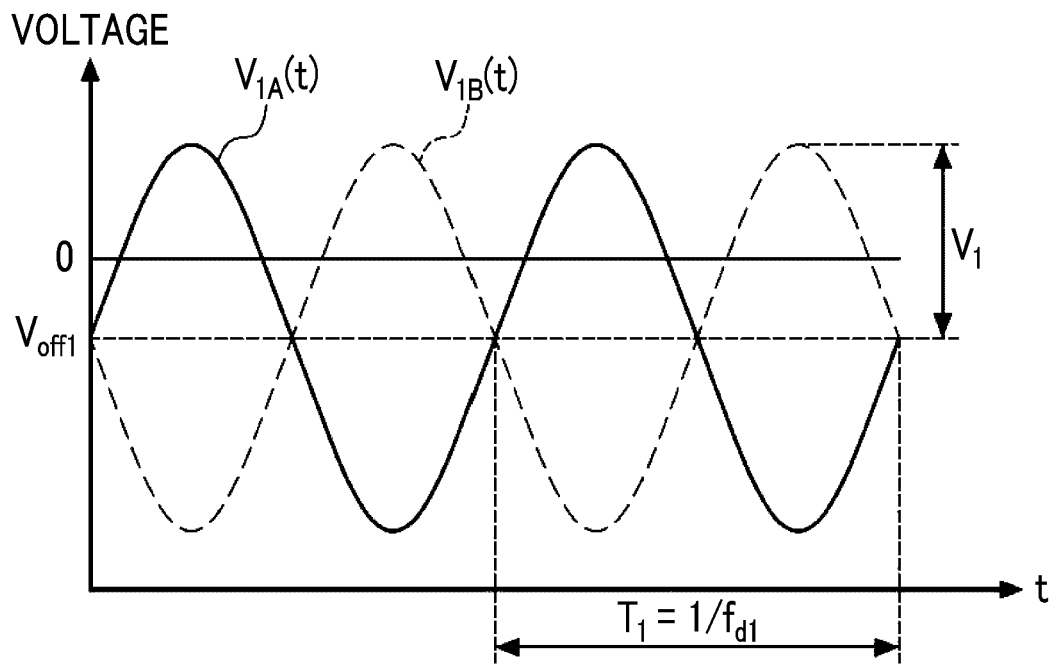
FIGS. 9A and 9B are diagrams showing examples of a first driving signal and a second driving signal.
Figure 9B:
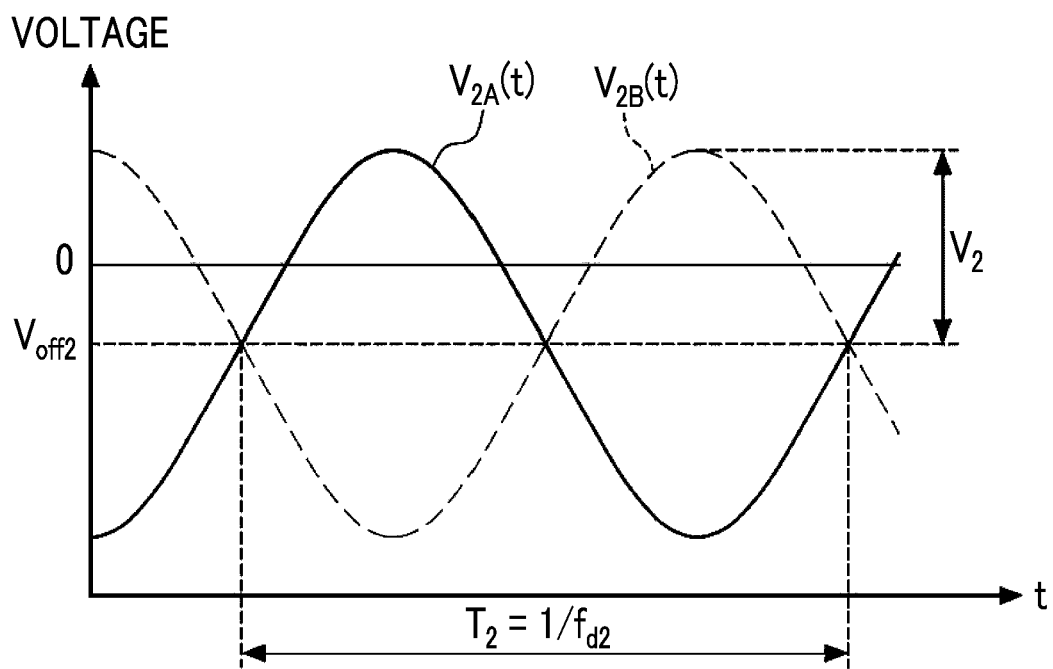

FIGS. 9A and 9B show examples of the first driving signal and the second driving signal. FIG. 9A shows the driving voltage waveforms VIA (t) and $V_{1B}$ (t) included in the first driving signal. FIG. 9B shows the driving voltage waveforms $V_{2A}$ (t) and $V_{2B}$ (t) included in the second driving signal.

The driving voltage waveforms VIA (t) and $V_{1B}$ (t) are represented as follows, respectively.

$$V_{1A}(t)=V_{off1}+V_1 \sin(2\pi f_{d1} t)$$

$$V_{1B}(t)=V_{off1}+V_1 \sin(2\pi f_{d1} t+\alpha)$$

Here, $V_1$ is the amplitude voltage. $V_{off1}$ is the bias voltage. $f_{d1}$ is the driving frequency (hereinafter, referred to as the first driving frequency). t is time. α is the phase difference between the driving voltage waveforms $V_{1A}$ (t) and $V_{1B}$ (t). In the present embodiment, for example, α=180°.

By applying the driving voltage waveforms $V_{1A}$ (t) and $V_{1B}$ (t) to the pair of second actuators 25, the mirror portion 20 swings around the first axis $a_1$ at the first driving frequency $f_{d1}$ (see FIG. 7).

The driving voltage waveforms $V_{2A}$ (t) and $V_{2B}$ (t) are represented as follows, respectively.

$$V_{2A}(t)=V_{off2}+V_2 \sin(2\pi f_{d2} t+\varphi)$$

$$V_{2B}(t)=V_{off2}+V_2 \sin(2\pi f_{d2} t+\beta+\varphi)$$

Here, $V_2$ is the amplitude voltage. $V_{off2}$ is the bias voltage. $f_{d2}$ is the driving frequency (hereinafter, referred to as the second driving frequency). t is time. β is the phase difference between the driving voltage waveforms $V_{2A}$ (t) and $V_{2B}$ (t). In the present embodiment, for example, β=180°. In addition, q is the phase difference between the driving voltage waveforms $V_{1A}$ (t) and $V_{1B}$ (t) and the driving voltage waveforms $V_{2A}$ (t) and $V_{2B}$ (t). In the present embodiment, for example, $V_{off1}=V_{off2}=0$ V.

By applying the driving voltage waveforms $V_{2A}$ (t) and $V_{2B}$ (t) to the pair of first actuators 24, the mirror portion 20 swings around the second axis $a_2$ at the second driving frequency $f_{d2}$ (see FIG. 8).

The first driving frequency $f_{d1}$ is set so as to match the resonance frequency around the first axis a of the mirror portion 20 (hereinafter, referred to as a first resonance frequency). The second driving frequency $f_{d2}$ is set so as to match the resonance frequency around the second axis $a_2$ of the mirror portion 20 (hereinafter, referred to as a second resonance frequency). In the present embodiment, $f_{d1}>f_{d2}$. That is, in the mirror portion 20, a swing frequency around the first axis $a_1$ is higher than a swing frequency around the second axis $a_2$.

A plurality of resonance modes having different orders exist for the resonance of the mirror portion 20 in addition to the above-described phase (in-phase or anti-phase). For example, the first driving frequency $f_{d1}$ is set to a value matching a resonance frequency of the resonance mode in which the largest deflection angle is obtained in the anti-phase resonance mode group around the first axis $a_1$. In the present embodiment, for example, the first driving frequency $f_{d1}$ is matched with a resonance frequency of the second lowest-order resonance mode in the anti-phase resonance mode group. Hereinafter, the resonance mode around the first axis $a_1$ is referred to as a high-speed scan mode.

In addition, for example, the second driving frequency $f_{d2}$ is set to a value matching a resonance frequency of the resonance mode in which the largest deflection angle is obtained in the in-phase resonance mode group around the second axis $a_2$. In the present embodiment, for example, the second driving frequency $f_{d2}$ is matched with a resonance frequency of the second lowest-order resonance mode in the in-phase resonance mode group. Hereinafter, the resonance mode around the second axis $a_2$ is referred to as a low-speed scan mode.

The order of the resonance mode in which the largest deflection angle is obtained changes depending on a shape or the like of the first actuator 24 and the second actuator 25. Therefore, the first driving frequency $f_{d1}$ and the second driving frequency $f_{d2}$ may be matched with frequencies of resonance modes of other orders, respectively.

Figure 10:
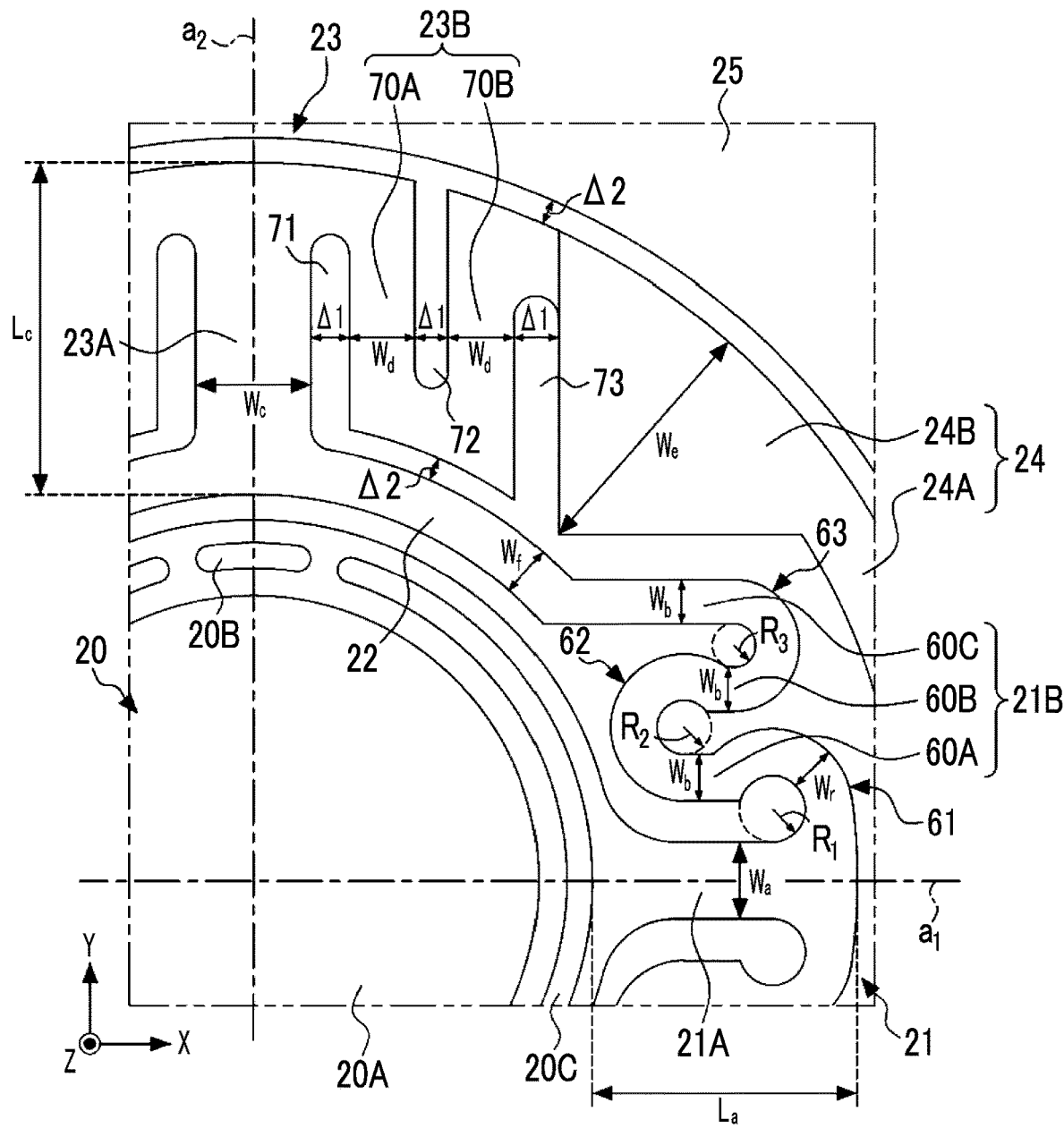
FIG. 10 is a diagram showing a configuration of a first support portion 21 and a second support portion 23.

FIG. 10 shows an example of the configuration of the first support portion 21 and the second support portion 23 in detail. The coupling portion 21B included in the first support portion 21 is symmetrically disposed on both sides of the first axis $a_1$ as a main shaft and has a plurality of sub-shafts stretched along the first axis $a_1$. The main shaft and the plurality of sub-shafts each have a uniform thickness.

In the present embodiment, the coupling portion 21B has three sub-shafts, that is, a first sub-shaft 60A, a second sub-shaft 60B, and a third sub-shaft 60C. The first sub-shaft 60A, the second sub-shaft 60B, and the third sub-shaft 60C are disposed in parallel with the swing shaft 21A in order from a side of the swing shaft 21A. The first sub-shaft 60A, the second sub-shaft 60B, and the third sub-shaft 60C have the same width $W_b$. The width $W_b$ is smaller than a width $W_a$ of the swing shaft 21A. The width $W_a$ is smaller than a length La of the swing shaft 21A.

By connecting the first sub-shaft 60A, the second sub-shaft 60B, and the third sub-shaft 60C to each other, a first folded portion 61, a second folded portion 62, and a third folded portion 63 are formed. The number of the folded portions is not limited to three, and three or more folded portions need only be formed.

The first folded portion 61 is formed by connecting one end of the first sub-shaft 60A and an end portion of the swing shaft 21A on a side opposite to the mirror portion 20. The first folded portion 61 is a part of an annulus having a width $W_r$. The first folded portion 61 is disposed such that an apex of an inner circle on a side of the swing shaft 21A is in contact with the swing shaft 21A.

The second folded portion 62 is formed by connecting the other end of the first sub-shaft 60A and one end of the second sub-shaft 60B. The second folded portion 62 is a part of an annulus having a width $W_r$. The second folded portion 62 is disposed such that an apex of an inner circle on a side of the swing shaft 21A is in contact with the first sub-shaft 60A.

The third folded portion 63 is formed by connecting the other end of the second sub-shaft 60B and one end of the third sub-shaft 60C. The third folded portion 63 is a part of an annulus having a width $W_r$. The third folded portion 63 is disposed such that an apex of an inner circle on a side of the swing shaft 21A is in contact with the second sub-shaft 60B. The third sub-shaft 60C is connected to the movable frame 22 having a width $W_f$.

In a case where an inner curvature radius of the first folded portion 61 is denoted by $R_1$, an inner curvature radius of the second folded portion 62 is denoted by $R_2$, and an inner curvature radius of the third folded portion 63 is denoted by $R_3$, the curvature radii $R_1$, $R_2$, and $R_3$ satisfy a relationship of Equations (1) and (2).

$$0.73 \leq R_2/R_1 \leq 0.9 \quad (1)$$

$$0.73 \leq R_3/R_2 \leq 0.9 \quad (2)$$

As will be described in detail below, in a case where the curvature radii $R_1$, $R_2$, and $R_3$ satisfy the above relationship, the internal stress applied to the swing shaft 21A is relaxed in a case where the mirror portion 20 swings around the first axis $a_1$. By relaxation of the internal stress, it is possible to increase the maximum deflection angle of the mirror portion 20 around the first axis $a_1$. In a range in which the curvature radii $R_1$, $R_2$, and $R_3$ satisfy the above relationship, the folded structure of the coupling portion 21B does not become excessively large, and an increase in moment of inertia around the second axis $a_2$ can be suppressed. As a result, a decrease in second resonance frequency can be suppressed.

In a case where the coupling portion 21B has three or more folded portions, assuming that inner curvature radii of the folded portions are set to $R_1$, $R_2$, $R_3$, ..., in order from the closest to the first axis, a relationship of Equation (3) need only be satisfied.

$$0.73 \leq R_{k+1}/R_k \leq 0.9 \, (k=1,2,\ldots) \quad (3)$$

The coupling portion 23B of the second support portion 23 has a plurality of sub-shafts stretched in the direction of the second axis $a_2$. In the present embodiment, the coupling portion 23B has two sub-shafts, that is, a first sub-shaft 70A and a second sub-shaft 70B. The first sub-shaft 70A and the second sub-shaft 70B are disposed in parallel with the swing shaft 23A in order from a side of the swing shaft 23A. The first sub-shaft 70A and the second sub-shaft 70B have the same width $W_d$. The width $W_d$ is smaller than a width $W_c$ of the swing shaft 23A. The width $W_c$ is smaller than a length Lc of the swing shaft 23A.

One end of the first sub-shaft 70A is connected to an end portion of the swing shaft 23A on a side opposite to the mirror portion 20, and the other end thereof is connected to one end of the second sub-shaft 70B. The other end of the second sub-shaft 70B is connected to the fan-shaped portion 24B of the first actuator 24.

A slit 71 stretched in the direction of the second axis $a_2$ is formed between the first sub-shaft 70A and the swing shaft 23A. A slit 72 stretched in the direction of the second axis $a_2$ is formed between the first sub-shaft 70A and the second sub-shaft 70B. A slit 73 stretched in the direction of the second axis $a_2$ is formed between the second sub-shaft 70B and the fan-shaped portion 24B. The slits 71, 72, and 73 all have the same width $\Delta 1$.

The coupling portion 23B has an interval 42 with the movable frame 22 and an interval $\Delta 2$ with the second actuator 25, the intervals being equal to each other.

At least a part of the width of the first actuator 24 in a direction orthogonal to the stretching direction (that is, the circumferential direction with the center of the mirror portion 20 as the rotation axis) is larger than a width $W_a$ of the swing shaft 21A in a direction along the second axis $a_2$. In the present embodiment, a width $W_e$ of the fan-shaped portion 24B is larger than the width $W_a$ of the swing shaft 21A. The width $W_e$ corresponds to the radius of the fan-shaped portion 24B. As described above, by making at least a part of the width of the first actuator 24 in the direction orthogonal to the stretching direction larger than the width $W_a$ of the swing shaft 21A, the area of the first actuator 24 is expanded and large rotational torque is obtained.

In the MMD 2, the first support portion 21 and the second support portion 23 are not provided with the piezoelectric element, and the first actuator 24 and the second actuator 25 of piezoelectric type are provided separately from the first support portion 21 and the second support portion 23. Therefore, large rotational torque is obtained without increasing the moment of inertia around the first axis $a_1$ and the second axis $a_2$.

EXAMPLES

Hereinafter, examples of the micromirror device (MMD) according to the technique of the present disclosure will be described. The present applicant obtained the internal stress (maximum value of Si stress) applied to the swing shaft 21A of the first support portion 21 in a case where the MMD 2 is simultaneously driven around the first axis $a_1$ and the second axis $a_2$ by a vibration analysis simulation using a finite element method.

(Dimensions of MMD)

First, parameters relating to the dimensions of the components of the MMD2 used in the present example will be described. The parameters relating to the width, length, and the like of the components included in the first support portion 21 and the second support portion 23 are as described in FIG. 10.

Figure 11:
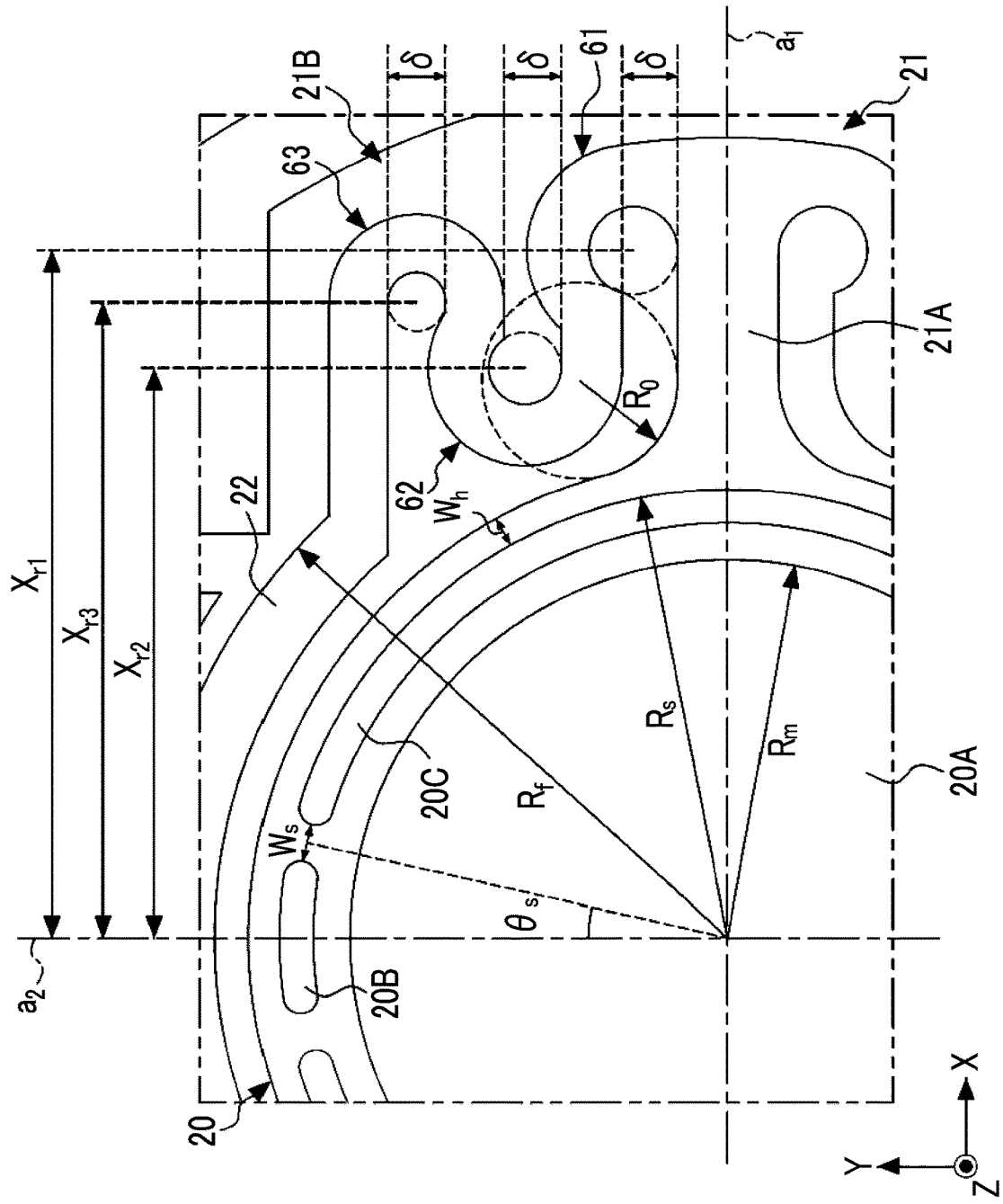
FIG. 11 is a diagram showing parameters relating to dimensions of components of the micromirror device.

FIGS. 11 to 14 show other parameters relating to the dimensions of the components of the MMD 2. In FIG. 11, $R_m$ is a radius of the reflecting surface 20A. $R_S$ is a curvature radius of an outer peripheral portion of the slits 20B and 20C. $R_f$ is a curvature radius of an outer peripheral portion of the movable frame 22. $W_s$ is an interval between the slit 20B and the slit 20C. $\theta_s$ is an angle formed by a line connecting a portion between the slit 20B and the slit 20C and the center of the reflecting surface 20A with the second axis $a_2$.

$W_h$ is a width of an outer edge portion (so-called rim) located outside the slits 20B and 20C of the mirror portion 20. $R_0$ is a curvature radius at a connection portion between the swing shaft 21A and the mirror portion 20. $\delta$ is an interval between the sub-shafts included in the coupling portion 21B. $X_{r1}$ is a distance from the center of the circle of the first folded portion 61 to the second axis $a_2$. $X_{r2}$ is a distance from the center of the circle of the second folded portion 62 to the second axis $a_2$. $X_{r3}$ is a distance from the center of the circle of the third folded portion 63 to the second axis $a_2$.

Figure 12:
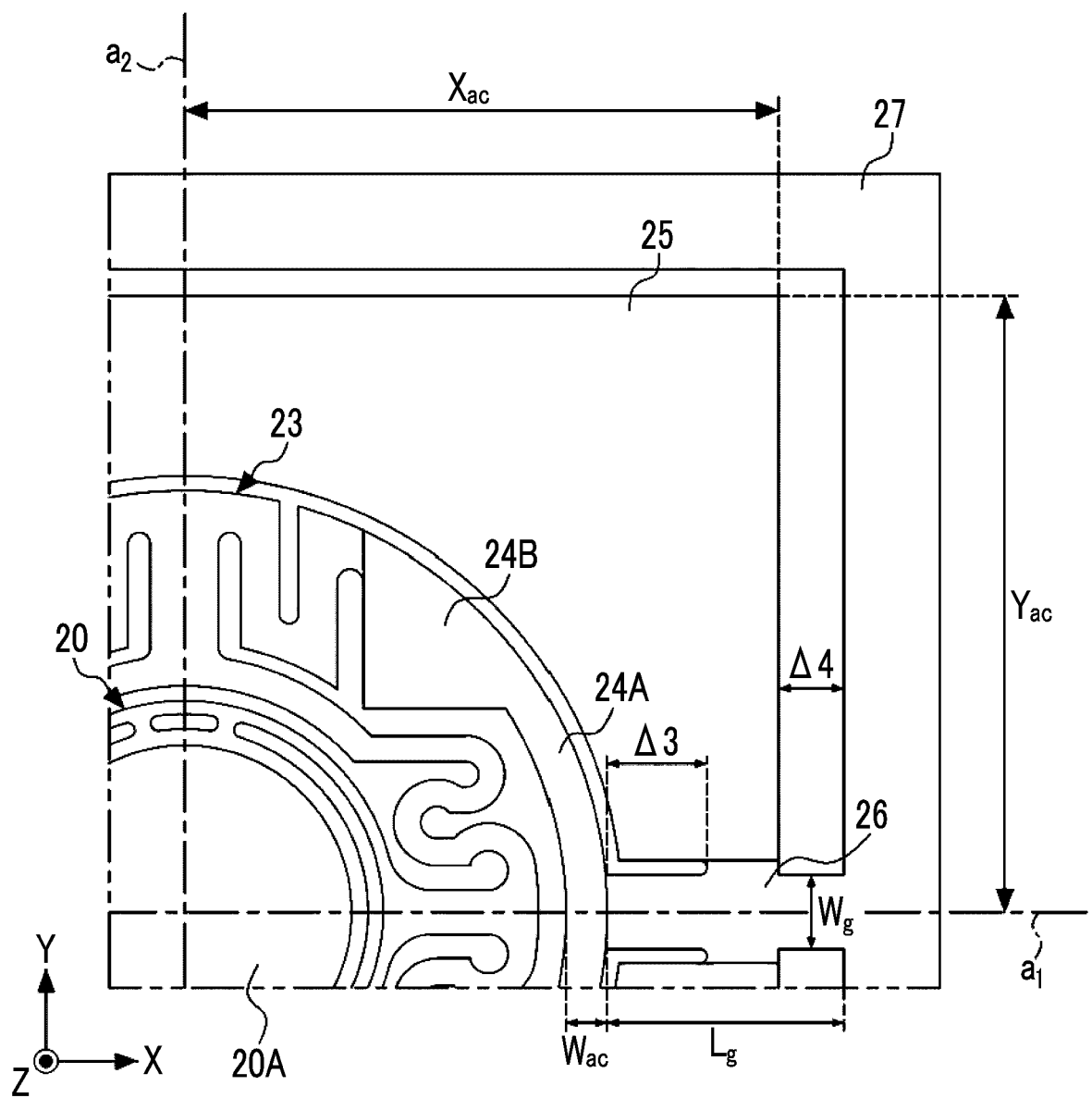
FIG. 12 is a diagram showing parameters relating to dimensions of components of the micromirror device.

In FIG. 12, $X_{ac}$ is a distance from an end portion of the second actuator 25 in the X direction to the second axis $a_2$. $Y_{ac}$ is a distance from an end portion of the second actuator 25 in the Y direction to the first axis $a_1$. $W_{ac}$ is a width of the arc-shaped portion 24A of the first actuator 24. $W_g$ is a width of the connecting portion 26. $L_g$ is a length of the connecting portion 26. $\Delta 3$ is a length from an end portion of the connecting portion 26 on a side of the first actuator 24 to a portion to which the second actuator 25 is connected. $\Delta 4$ is an interval between the second actuator 25 and the fixed frame 27 in the X direction.

Figure 13:
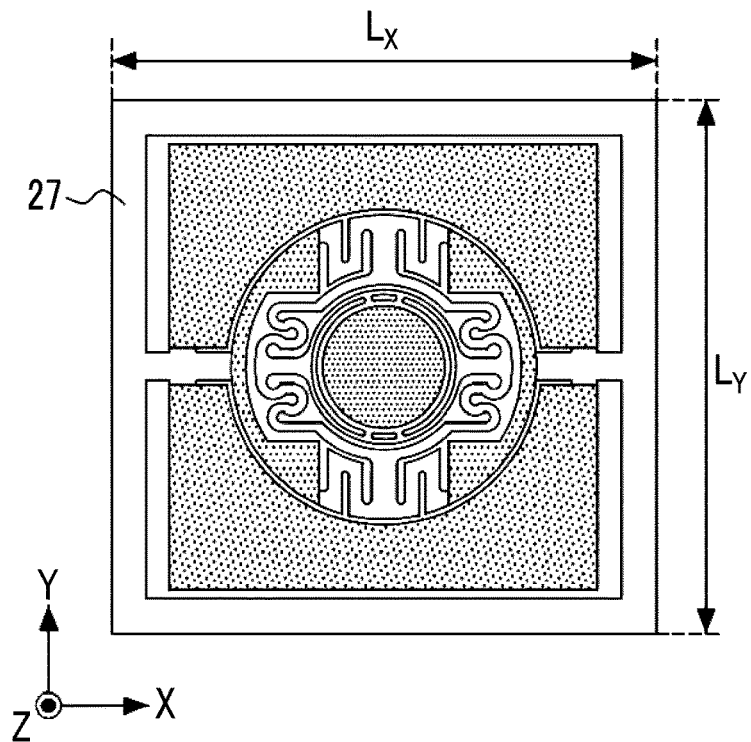
FIG. 13 is a diagram showing parameters relating to dimensions of components of the micromirror device.

In FIG. 13, $L_X$ is a length of one side of the fixed frame 27 in the X direction. $L_Y$ is a length of one side of the fixed frame 27 in the Y direction.

Figure 14:
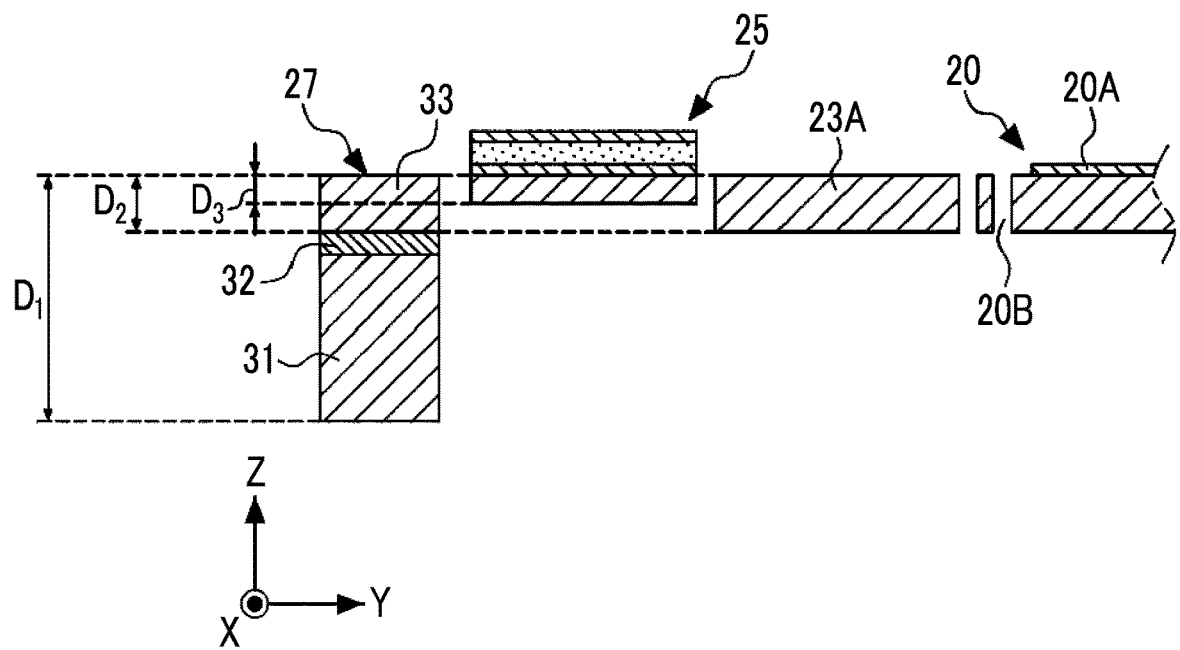
FIG. 14 is a diagram showing parameters relating to dimensions of components of the micromirror device.

In FIG. 14, $D_1$ is a thickness of the fixed frame 27. $D_2$ is a thickness of the second silicon active layer 33 constituting the mirror portion 20, the first support portion 21, the movable frame 22, the second support portion 23, and the first actuator 24. $D_3$ is a thickness of the second silicon active layer 33 constituting the second actuator 25.

FIG. 15 shows set values of various parameters used in the present simulation. The present applicant obtained the first resonance frequency $f_1$ in the high-speed scan mode, the second resonance frequency $f_2$ in the low-speed scan mode, and the internal stress (maximum value of Si stress) applied to the swing shaft 21A of the first support portion 21 by a resonance mode analysis simulation using a finite element method. The internal stress was obtained by calculating a Mises stress $\sigma_{Mises}$ in a case where the mirror portion 20 was driven in the high-speed scan mode until the maximum deflection angle was ±17°.

The high-speed scan mode is the second lowest-order resonance mode in the above-described anti-phase resonance mode group. The low-speed scan mode is the second lowest-order resonance mode in the above-described in-phase resonance mode group.

In addition, as shown in FIG. 16, the present applicant created twelve models having different curvature radii $R_1$, $R_2$, and $R_3$, and obtained the first resonance frequency $f_1$, the second resonance frequency $f_2$, and the Mises stress $\sigma_{Mises}$ for each model.

In general, the larger the Mises stress $\sigma_{Mises}$, the higher the risk of Si breakdown. From experience, Si breakdown occurs at a Mises stress $\sigma_{Mises}$ of 2.26 GPa or more. Based on these findings, the present applicant determined a model with $\sigma_{Mises} \geq 2.26$ GPa as failed (F), and determined a model with $\sigma_{Mises} < 2.26$ GPa as passed (P). As shown in FIG. 16, all the model numbers 1 to 5 were determined as failed, and all the model numbers 6 to 12 were determined as passed.

In the model numbers 1 to 5, at least one of a ratio $R_2/R_1$ or a ratio $R_3/R_2$ is greater than 0.9. On the other hand, in the model numbers 6 to 12, both ratios $R_2/R_1$ and $R_3/R_2$ are 0.9 or less. Therefore, in a case where a relationship of Equation (4) is satisfied, $\sigma_{Mises} < 2.26$ GPa.

$$R_{k+1}/R_k \leq 0.9 (k=1,2,\ldots) \qquad (4)$$

That is, the model numbers 6 to 12 are examples of the technique of the present disclosure, and the model numbers 1 to 5 are comparative examples.

Figure 17:
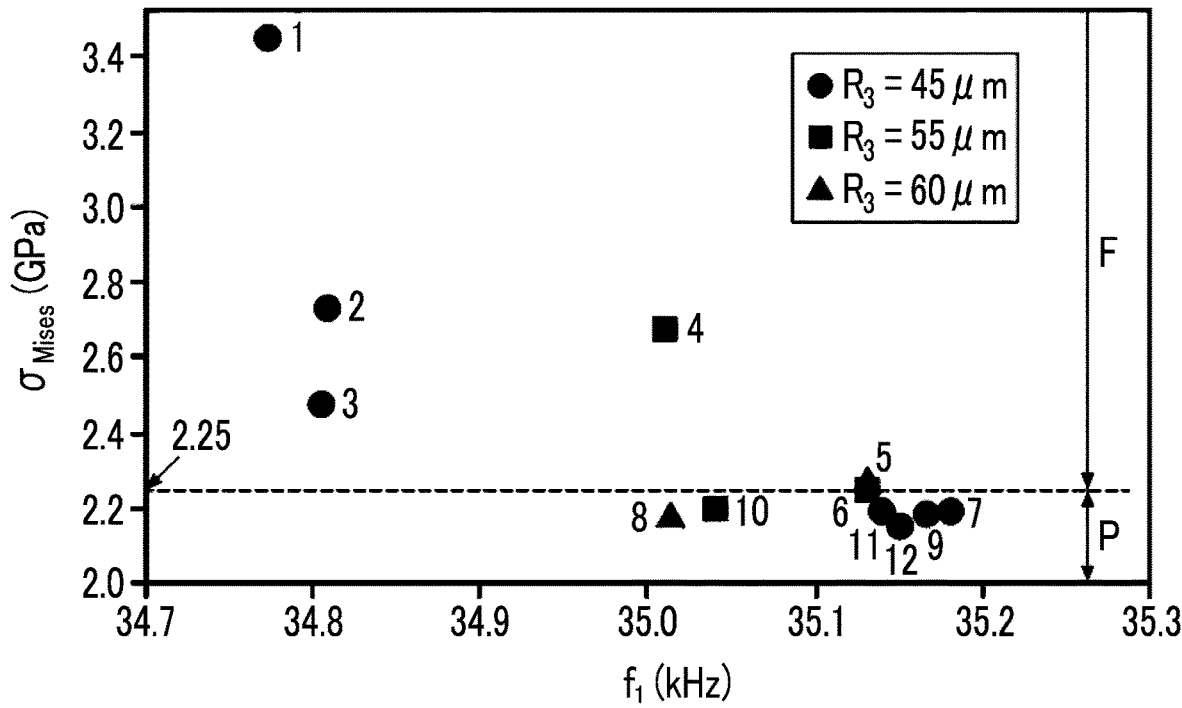
FIG. 17 is a graph showing a relationship between a Mises stress and a first resonance frequency.

FIG. 17 shows a relationship between the Mises stress $\sigma_{Mises}$ and the first resonance frequency $f_1$. As shown in FIG. 17, in the models (model numbers 6 to 12) belonging to the examples, a high first resonance frequency $f_1$ is obtained.

Figure 18:
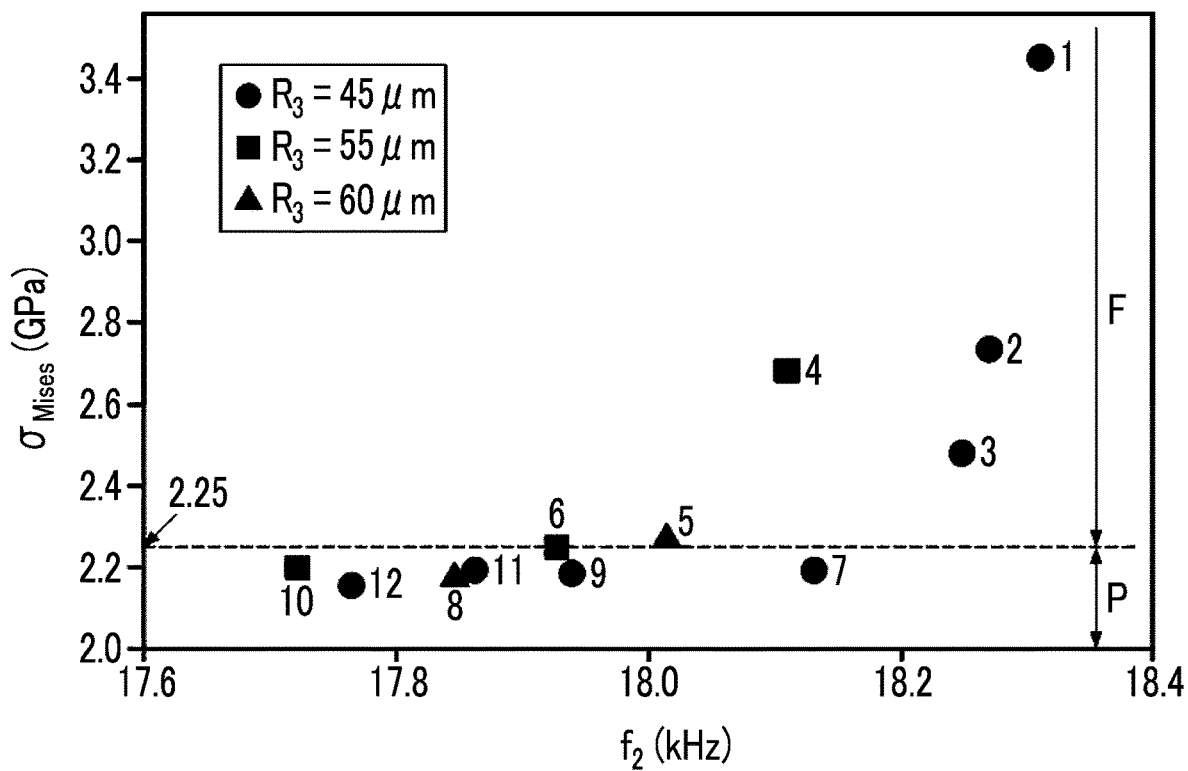
FIG. 18 is a graph showing a relationship between a Mises stress and a second resonance frequency.

FIG. 18 shows a relationship between the Mises stress $\sigma_{Mises}$ and the second resonance frequency $f_2$. According to FIG. 18, regarding the second resonance frequency $f_2$, it can be seen that the second resonance frequency $f_2$ decreases in a case where a value of $R_{k+1}/R_k$ is small. This is because in a case where the value of $R_{k+1}/R_k$ is set too low, the structure of the coupling portion 21B becomes too large, so that the moment of inertia increases. The present applicant determined 0.73 as a lower limit value of $R_{k+1}/R_k$ as a limit in which the sub-shafts included in the coupling portion 21B do not come into contact with each other.

The configuration of the MMD 2 shown in the above embodiment is an example and can be changed as appropriate. For example, in the above-described embodiment, although the coupling portion 23B of the second support portion 23 has a folded structure, this folded structure is not essential and can be omitted.

The hardware configuration of the driving controller 4 can be variously modified. The processing unit of the driving controller 4 may be composed of one processor or may be composed of a combination of two or more processors of the same type or different types. The processor includes, for example, a CPU, a programmable logic device (PLD), or a dedicated electric circuit. As is well known, the CPU is a general-purpose processor that executes software (program) to function as various processing units. The PLD is a processor such as a field programmable gate array (FPGA) whose circuit configuration can be changed after manufacture. The dedicated electric circuit is a processor that has a dedicated circuit configuration designed to perform a specific process, such as an application specific integrated circuit (ASIC).

All documents, patent applications, and technical standards mentioned in this specification are incorporated herein by reference to the same extent as in a case where each document, each patent application, and each technical standard are specifically and individually described by being incorporated by reference.

What is claimed is:
1. A micromirror device comprising:
a mirror portion having a reflecting surface that reflects incident light;
a first support portion that is connected to the mirror portion on a first axis located in a plane including the reflecting surface of the mirror portion in a stationary state, and that swingably supports the mirror portion around the first axis;
a pair of movable frames that are connected to the first support portion and face each other across the first axis;

a second support portion that is connected to the movable frame on a second axis which is located in the plane including the reflecting surface of the mirror portion in the stationary state and is orthogonal to the first axis, and that swingably supports the mirror portion, the first support portion, and the movable frame around the second axis; and a pair of first actuators that are connected to the second support portion and face each other across the second axis, each of which having a piezoelectric element, wherein the first support portion is composed of a main shaft stretched along the first axis and a plurality of sub-shafts symmetrically disposed on both sides of the main shaft across the first axis and stretched along the first axis, the first support portion has a folded structure having n folded portions, where n≥3, formed by connecting the plurality of sub-shafts, and in a case where inner curvature radii of the folded portions are denoted by $R_1$ to $R_n$, in order from the closest to the first axis, a relationship of $0.73 \leq R_{k+1}/R_k \leq 0.9$ is satisfied where $1 \leq k \leq n-1$.

2. The micromirror device according to claim 1, wherein the main shaft and the plurality of sub-shafts each have a uniform thickness.

3. The micromirror device according to claim 1, wherein at least a part of a width of the first actuator in a direction orthogonal to a stretching direction is larger than a width of the main shaft in a direction along the second axis.

4. The micromirror device according to claim 1, wherein the movable frame and the first actuator each have a U-shape.

5. The micromirror device according to claim 1, wherein the first actuator allows the mirror portion to swing around the second axis by applying a rotational torque around the second axis to the mirror portion and the movable frame.

6. The micromirror device according to claim 5, further comprising:
a fixed frame that surrounds the first actuator;
a connecting portion that connects the first actuator and the fixed frame; and
a second actuator that is connected to the connecting portion and is disposed inside the fixed frame and, the second actuator having a piezoelectric element,
wherein the second actuator allows the mirror portion to swing around the first axis by applying a rotational torque around the first axis to the mirror portion, the movable frame, and the first actuator.

7. The micromirror device according to claim 6, wherein the connecting portion is disposed along the first axis.

8. An optical scanning device comprising:
the micromirror device according to claim 6; and
a processor that drives the first actuator and the second actuator,
wherein the processor allows the mirror portion to resonate around the first axis and the second axis by providing a driving signal to the first actuator and the second actuator.

* * * * *